(12) United States Patent
Urabe et al.

(10) Patent No.: US 8,764,085 B2
(45) Date of Patent: Jul. 1, 2014

(54) CLAMPING DEVICE AND WORKPIECE CONVEYING ROBOT

(71) Applicant: Sinfonia Technology Co., Ltd., Tokyo (JP)

(72) Inventors: Yuji Urabe, Tokyo (JP); Yasumichi Mieno, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 13/932,663

(22) Filed: Jul. 1, 2013

(65) Prior Publication Data

US 2014/0110959 A1   Apr. 24, 2014

(30) Foreign Application Priority Data

Oct. 19, 2012  (JP) ................................. 2012-232378

(51) Int. Cl.
*B66C 1/42*  (2006.01)
(52) U.S. Cl.
USPC ....... 294/103.1; 294/213; 901/36; 414/744.5; 414/744.8; 414/941
(58) Field of Classification Search
CPC ............ Y01S 414/135; Y01S 414/137; Y01S 294/902; Y01S 414/141; Y01S 294/907; H01L 21/67742; H01L 21/68707; B66C 1/48; B65G 47/90; B65J 15/0009; B65J 15/00; B65J 9/1612; B65J 15/10
USPC ......... 294/213, 103.1, 902, 119.1; 414/744.5, 414/744.6, 744.8, 935, 937, 941; 901/31, 901/36, 38
See application file for complete search history.

(56) References Cited

U.S. PATENT DOCUMENTS

| 6,685,422 | B2 * | 2/2004 | Sundar et al. ............... 414/744.5 |
| 6,752,442 | B2 * | 6/2004 | McNurlin et al. ............. 294/106 |
| 7,286,890 | B2 * | 10/2007 | Machiyama et al. .......... 700/114 |
| 7,661,921 | B2 * | 2/2010 | Kim et al. ................... 414/744.5 |
| 2002/0071756 | A1 * | 6/2002 | Gonzalez ....................... 414/941 |

FOREIGN PATENT DOCUMENTS

JP           4600856 B2    12/2010

* cited by examiner

*Primary Examiner* — Stephen Vu
(74) *Attorney, Agent, or Firm* — Westerman, Hattori, Daniels & Adrian, LLP

(57) ABSTRACT

A clamping device comprising: a distal end side stationary blocks which are provided on a side of a distal end of a workpiece retaining base, and in which stationary tilt faces tilting downwardly to a central direction of the workpiece are formed; a proximal end side stationary blocks which are provided on a side of a proximal end of the workpiece retaining base, and in which upward stationary tilt faces tilting downward toward the central direction of the workpiece are formed; and a movable block which is arranged at a position proximal to the proximal end side stationary blocks, and is capable of advancing to or retracting from a side of the distal end side stationary blocks with the workpiece being held between the blocks, and in which a downward movable tilt face tilting upwardly toward the central direction of the workpiece is formed.

11 Claims, 12 Drawing Sheets

(c) Enlarged view of C portion in Fig.3  (d) Enlarged view of D portion in Fig.3

Enlarged view of E portion in Fig.3

CLAMPING DEVICE AND WORKPIECE CONVEYING ROBOT

CROSS REFERENCE TO RELATED APPLICATIONS

This application claims priority of Japanese Patent Application No. 2012-232378 filed on Oct. 19, 2012. The contents of the application are incorporated herein by reference in their entirety.

BACKGROUND OF THE INVENTION

1. Field of the Invention

The present invention relates to a clamping device for retaining a workpiece when conveying the workpiece needed to be positioned with a high precision and a workpiece conveying robot including the clamping device.

2. Description of the Related Art

Conventionally, in order to convey workpieces such as semiconductor wafers or glass substrates, there is used a workpiece conveying robot for retaining and conveying these workpieces on a hand portion.

In the case of applying precision processing to such workpieces, a workpiece conveying robot is needed to deliver these workpieces to a device in a next step with a high positional precision. Thus, the workpiece conveying robot is required to retain and convey the workpieces placed on the hand portion while performing positioning on the hand portion with a high precision and then deliver the workpieces while maintaining a position precision of the workpieces.

In order to cause the hand portion to have the function as described above, a clamping device for precisely retaining a workpiece is provided at the hand portion. As this clamping device, for example, there exists a substrate retaining device described in Granted Japanese Patent No. 4600856. This device is configured in such a manner that stationary clamps are respectively provided in a pair at a distal end side and a proximal end side of the hand portion (a hand), and a movable clamp is provided between the fixing clamps on the proximal end side. In addition, at these stationary clamps and the movable clamp, upward tilt faces tilting downwardly toward a central direction of all of the workpieces (wafers) are formed. Further, after the workpieces have been placed on the stationary clamps, the movable clamp is moved from the outside of the workpieces toward the central direction, whereby retention of the workpieces are performed while alignment of the workpieces are precisely performed by means of the stationary clamp on the distal end side and the movable clamp.

However, the clamping device (a substrate retaining device) described in Granted Japanese Patent No. 4600856 performs positioning by means of the stationary clamp on the distal end side and the movable clamp on the proximal end side when retaining a workpiece and thus there is an apprehension that the workpiece is spaced from the stationary clamp on the proximal end side. Therefore, when the movable clamp is retracted to thereafter release retention of the workpiece, a current state changes from a state in which the proximal end side of the workpiece is supported by means of the movable clamp to a state in which it is supported by means of the stationary clamp and thus a position of the workpiece may be shifted accordingly.

Herein, in order to specifically clarify the problem described above, a conventional clamping device 901 having a configuration which is similar to that of Granted Japanese Patent No. 4600856 is schematically shown in FIG. 11 and FIG. 12.

In this clamping device 901, stationary blocks (equivalent to stationary clamps) 941, 951 are respectively provided in a pair on a side of a distal end 31$b$ and on a side of a proximal end 31$a$ of a workpiece retaining base 31 (these blocks are shown for short on one-by-one basis in the figures), and in these stationary blocks 941, 951, upward tilt faces 941$a$, 951$a$, which tilt downwardly toward a center of a workpiece W, are respectively provided. In addition, in the stationary block 941 on the side of the distal end 31$b$, a protrusion portion 941$b$ that is continuous to the upward tilt face 941$a$ and extends upwardly is formed, and a side face 941$c$ inside of the protrusion portion is capable of abutting against a side face of the workpiece W.

Further, a movable block (equivalent to a movable clamp) 961 is provided between a pair of stationary blocks 951 that are provided on the side of the proximal end 31$a$, and at a distal end of the movable block, an upward tilt face 961$a$ tilting downwardly toward the center of the workpiece W is formed. Furthermore, a vertical face 961$c$ that is continuous to the tilt face 961$a$ and extends upwardly may also be formed.

When the workpiece W is retained by employing the thus configured clamping device, first, as shown in FIG. 11 ($a$), the workpiece W is placed so that an edge on a lower side forming a side face of the workpiece W, specifically a part of this side face, abuts against the upward tilt faces 941$a$, 951$a$ of the respective stationary blocks 941, 951. Further, as shown in FIG. 11 ($b$) to FIG. 11 ($c$), by moving the movable block 961 in the central direction of the workpiece W, the workpiece W is moved and subsequently while a side face of the workpiece is adapted to abut against the side face 941$c$ of the stationary block 941, positioning is performed and at the same time the workpiece W is retained.

At this juncture, an edge on an opposite side, that is, on the left side in the figure, is supported by means of the upward tilt face 961$a$ or the vertical face 961$e$ of the movable block 961 and then is spaced by the upward tilt face 951$a$ of the stationary block 951 on the side of the proximal end 31$a$.

The workpiece W is conveyed while it is thus retained, and thereafter, in the case where release of retention is performed at a predetermined position, as shown in FIG. 12 ($d$) to FIG. 12 ($e$), the movable block 961 is operated and retracted in an opposite direction to that of the workpiece W. At this juncture, the workpiece W loses the supporting exerted by the upward tilt face 961$a$ of the movable block 961 and then this workpiece is supported again by means of the upward tilt face 951$a$ of the stationary block 951 on the side of the proximal end 31$a$. At this time, the position of the workpiece W may be shifted in proportion to a distance spaced when the workpiece W is retained, and as shown in the figure, a case in which the workpiece W tilts or a case in which the workpiece is entirely positionally shifted downwardly is also presupposed.

In addition, as is understood from FIG. 11 ($c$), in this configuration, an upper side is released with the workpiece W being supported from a lateral side or a lower side when the workpiece is retained and thus if a vibration in a vertical direction occurs, the workpiece W may also be shifted upwardly to thereafter disable retention. That is, a force of retention of the workpiece W relative to a vibration can be said to be small.

It is an object of the present invention to effectively solve the problem as described above, and specifically, it is an object of the present invention to provide a clamping device for retaining a workpiece with a high positional precision, enabling release of retention while maintaining the position precision, and further, having a strong force of retention relative to a vibration, and a workpiece conveying robot including the clamping device.

SUMMARY OF THE INVENTION

In order to achieve the above-described object, the present invention takes the following means.

That is, a characteristic of the present invention is summarized in that a clamping device that is capable of performing retention and release of retention of a workpiece on a workpiece retaining base, the clamping device comprising: a distal end side stationary block which is provided on a side of a distal end of the workpiece retaining base and on the workpiece retaining base, and in which a stationary tilt face tilting downwardly toward a central direction of the workpiece is formed; a proximal end side stationary block which is provided on a side of a proximal end opposing to the distal end side stationary block with the workpiece being held between the blocks and on the workpiece retaining base, and in which an upward stationary tilt face tilting downwardly toward the central direction of the workpiece is formed; and a movable block which is arranged at a position proximal to the proximal end side stationary block, and is capable of advancing to or retracting from a side of the distal end side stationary block with the workpiece being held between the blocks, and in which a downward movable tilt face tilting upwardly toward the central direction of the workpiece is formed.

With such a configuration, at the time of retention of a workpiece, a stationary block and a movable block work together, thus making it possible to precisely perform positioning of the workpiece, and at that juncture, the workpiece is not spaced from each upward stationary tilt face, therefore, even if the movable block is retracted at the time of release of retention of the workpiece, the workpiece can be kept to be supported by means of such each upward stationary tilt face, thus making it possible to maintain a high positional precision without an occurrence of a positional shift of the workpiece. In addition, the workpiece is supported in a vertical direction when it is retained and therefore a strong force of retention is exerted, and even if a vibration occurs, the workpiece can be firmly retained.

Here in the present invention, a state of abutment against a side face of a workpiece includes abutting against an edge forming the side face.

In addition, when a movable block advances to a workpiece and then performs retention of the workpiece, in order to make it possible to perform precise positioning more stably without an occurrence of a positional shift of the workpiece in a transverse direction orthogonal to the advancement direction, it is preferable to configure a center of the movable block so as to be moved on a predetermined operational straight line, and to arrange the distal end side stationary block in a pair at positions that are symmetrical to each other with the operational straight line being held between the blocks in a planar view.

In addition, when a movable block advances to a workpiece and then performs retention of the workpiece, in order to prevent a positional shift of the workpiece in a vertical direction and enable more stable precise positioning, it is preferable to configure the proximal end side stationary block so as to be arranged in a pair at positions that are symmetrical to each other with the operational straight line being held between the blocks in a planar view.

In addition, in order to enable positioning with a high precision when retaining a workpiece, it is preferable to configure the distal end side stationary block so as to include a protrusion portion that is continuous to an upper end of a upward stationary tilt face and extends vertically upwardly.

Further, in order to enable retention and release of retention of a workpiece, it is preferable to further inclusively configure a controller that controls an advancing/retracting operation of a movable block to advance the movable block so that a downward movable tilt face abuts against a side face of the workpiece when the retention of the workpiece is performed on a workpiece retaining base for workpiece with the workpiece being placed across the upward stationary tilt face of such each stationary block, and to retract the movable block in a direction opposite to that, of the workpiece when release of retention of the workpiece is performed on a workpiece retaining base.

In order to make it possible to attain that the advantageous effects described above more significantly it is preferable that a shape of a workpiece targeted to be retained be a specific shape, and it is preferable that the workpiece be formed in the shape of a disk of which a side face is defined as an outer circumferential face.

Furthermore, the workpiece conveying robot of the present invention is characterized in that a hand portion is provided with the clamping device described above. With such a configuration, a workpiece can be retained with a high positional precision and with a great force of retention, which is strong relative to a vibration, and the workpiece can be delivered by performing release of retention while maintaining a high positional precision after the workpiece has been conveyed to a predetermined conveyance destination.

ADVANTAGEOUS EFFECTS

According to the present invention described above, there can be provided a clamping device and a workpiece conveying robot that are capable of retaining a workpiece with a high positional precision and releasing the retention of the workpiece while maintaining the positional precision, that are further having a strong force of retention relative to a vibration as well.

DETAILED DESCRIPTION OF THE EMBODIMENTS

Hereinafter, an embodiment of the present invention will be described with reference to the drawings.

Figure 1:
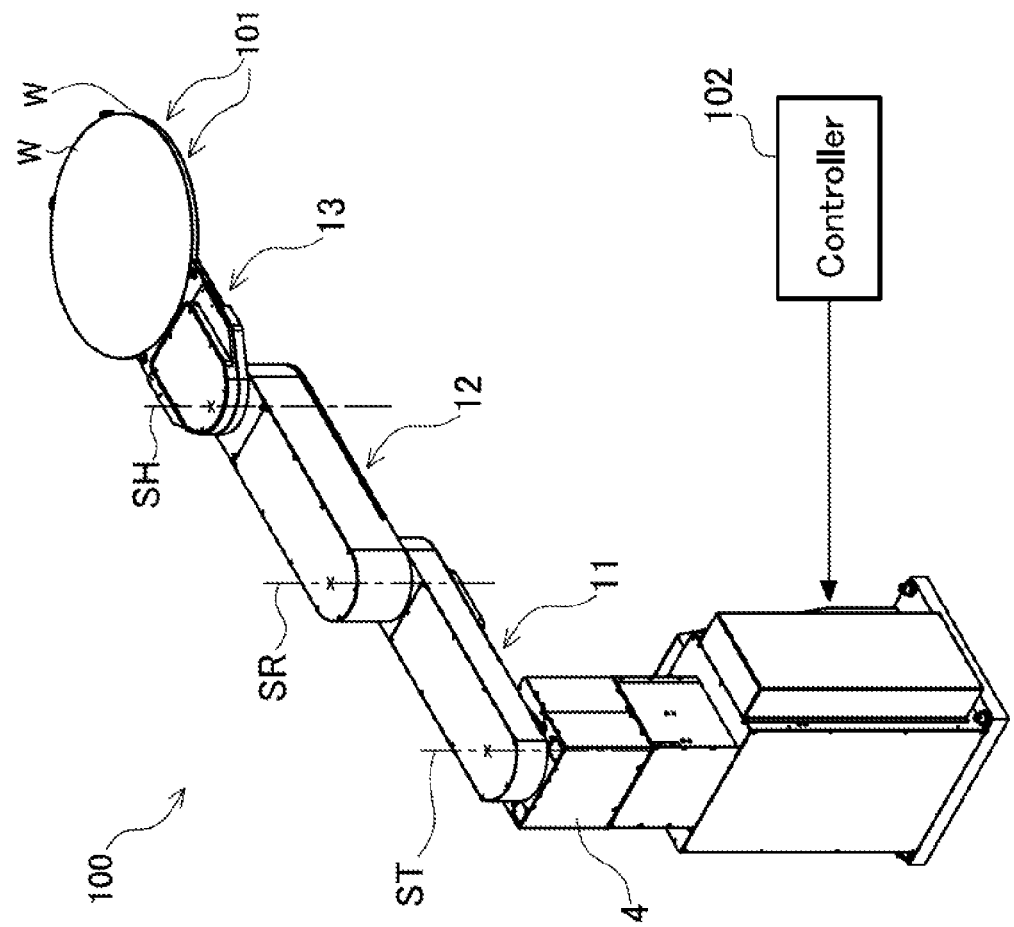
FIG. 1 is a perspective view of a clamping device and a workpiece conveying robot including the clamping device, according to an embodiment of the present invention.
Figure 11:
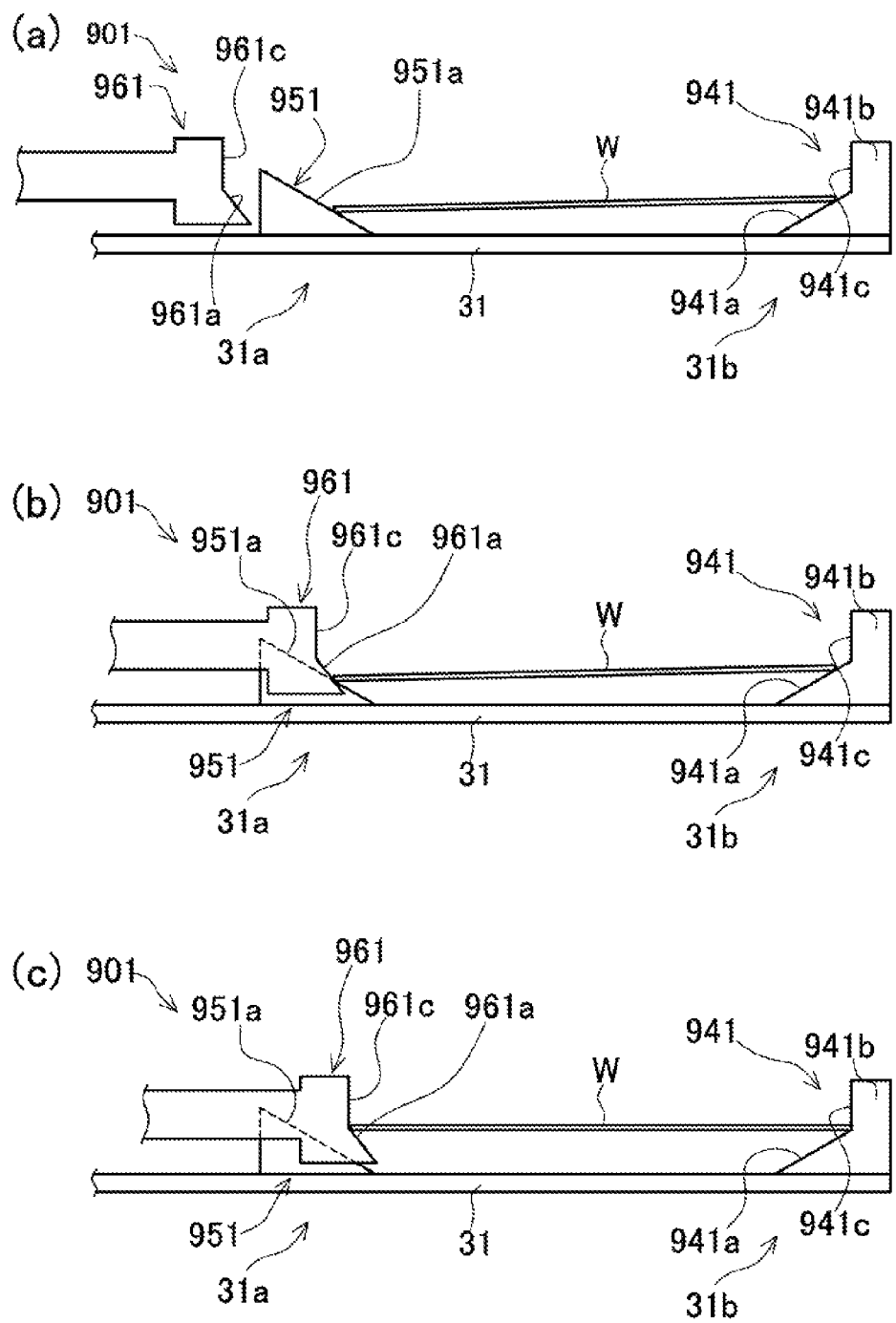
FIG. 11(a) through FIG. 11(c) are illustrative views schematically illustrating an operation of a conventional clamping device.
Figure 12:
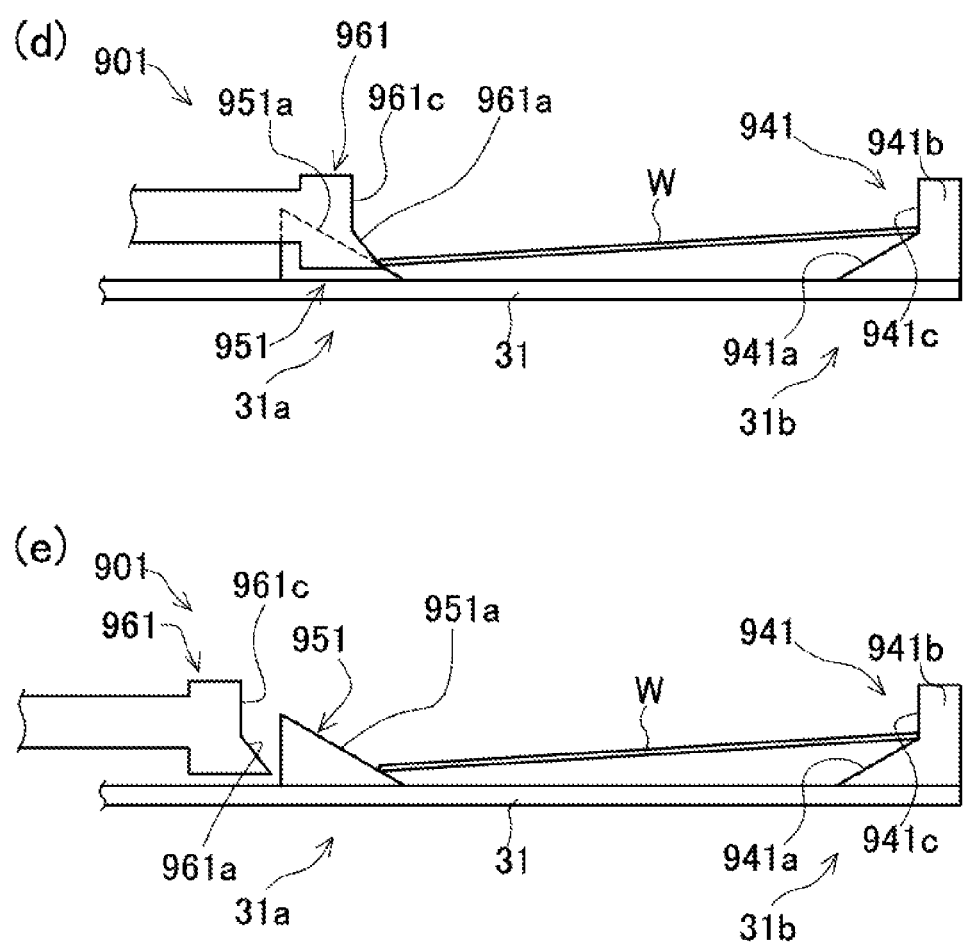
FIG. 12(d) and FIG. 12(e) are illustrative views schematically illustrating an operation of the conventional clamping device to be continued from FIG. 11.

FIG. 1 shows a workpiece conveying robot 100 in the embodiment. This workpiece conveying robot 100 is capable of receiving a workpiece W formed in the shape of a disk such as a semiconductor wafer and then conveying and delivering the received workpiece to a device in a next step. In the drawings employed for illustration in the embodiment, same reference numerals are assigned to same constituent elements of the conventional clamp device illustrated using FIG. 11 and FIG. 12. In addition, in the following description, a side face of a workpiece W designates an outer circumferential face of a disk.

As shown in FIG. 1, this workpiece conveying robot 100 is configured as a robot of a horizontal joint type having three joints, and relative to a base 4, a first arm element 11, a second arm element 12, and a hand portion 13 are provided so as to be sequentially relatively rotatable. Specifically the first arm element 11 is caused to be rotatable around a rotary shaft ST in a vertical direction set on the base 4. In addition, the second arm element 12 is caused to be rotatable around a rotary shaft SR in a vertical direction set at a distal end of the first arm element 11. Further, the hand portion 13 is caused to be rotatable around a rotary shaft SH in a vertical direction set at a distal end of the second arm element 12.

The hand portion 13 includes a clamping device 101, and via this clamping device 101, a workpiece W can be retained.

Rotation of these arm elements 11, 12 and hand portion 13 and retention and release of retention of the workpiece W in the clamping device 101 are performed by being controlled by means of a controller 102.

Figure 2:
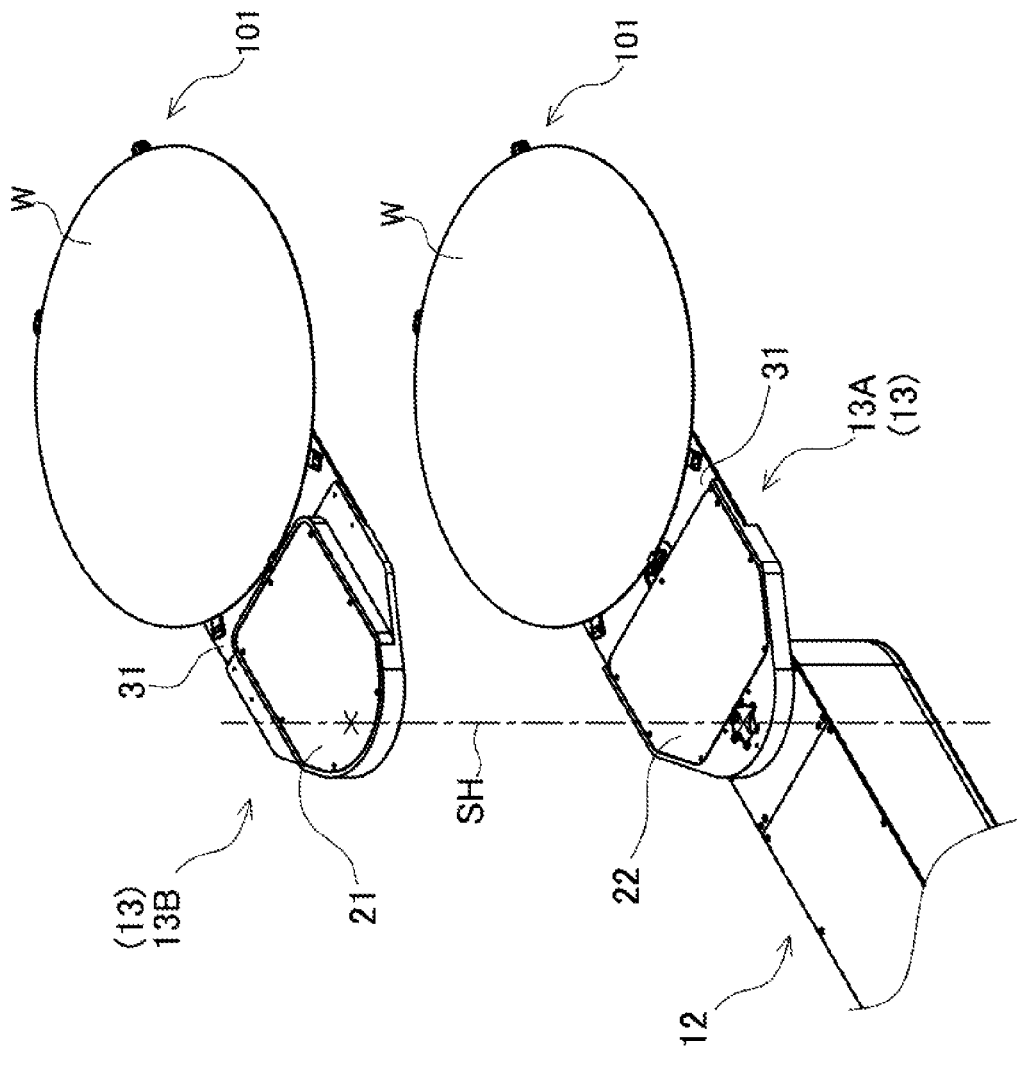
FIG. 2 is a perspective view showing essential portions of the workpiece conveying robot in an exploded manner.

The workpiece conveying robot 100 in the embodiment, as shown in FIG. 2, includes two hand portions 13A, 13B on the same rotary shaft SH. These hand portions 13A, 13B are caused to be rotatable independently around the rotary shaft SH, and a respective one of these hand portions can be delivered to a different conveyance destination while the workpiece W is retained. Such hand portions 13 can be configured so as to further increase in a vertical direction.

The hand portions 13A, 13B are identical to each other in basic configuration except that these hand portions are different from each other in configuration of base portions 21, 22 that are supported to be rotatable relative to the second arm element 12, and the clamping device 101 for retaining the workpiece W includes the same constituent elements. Therefore, a detailed description of the clamping device 101 will be given hereinafter focusing on the hand portion 13A provided downwardly.

Figure 3:
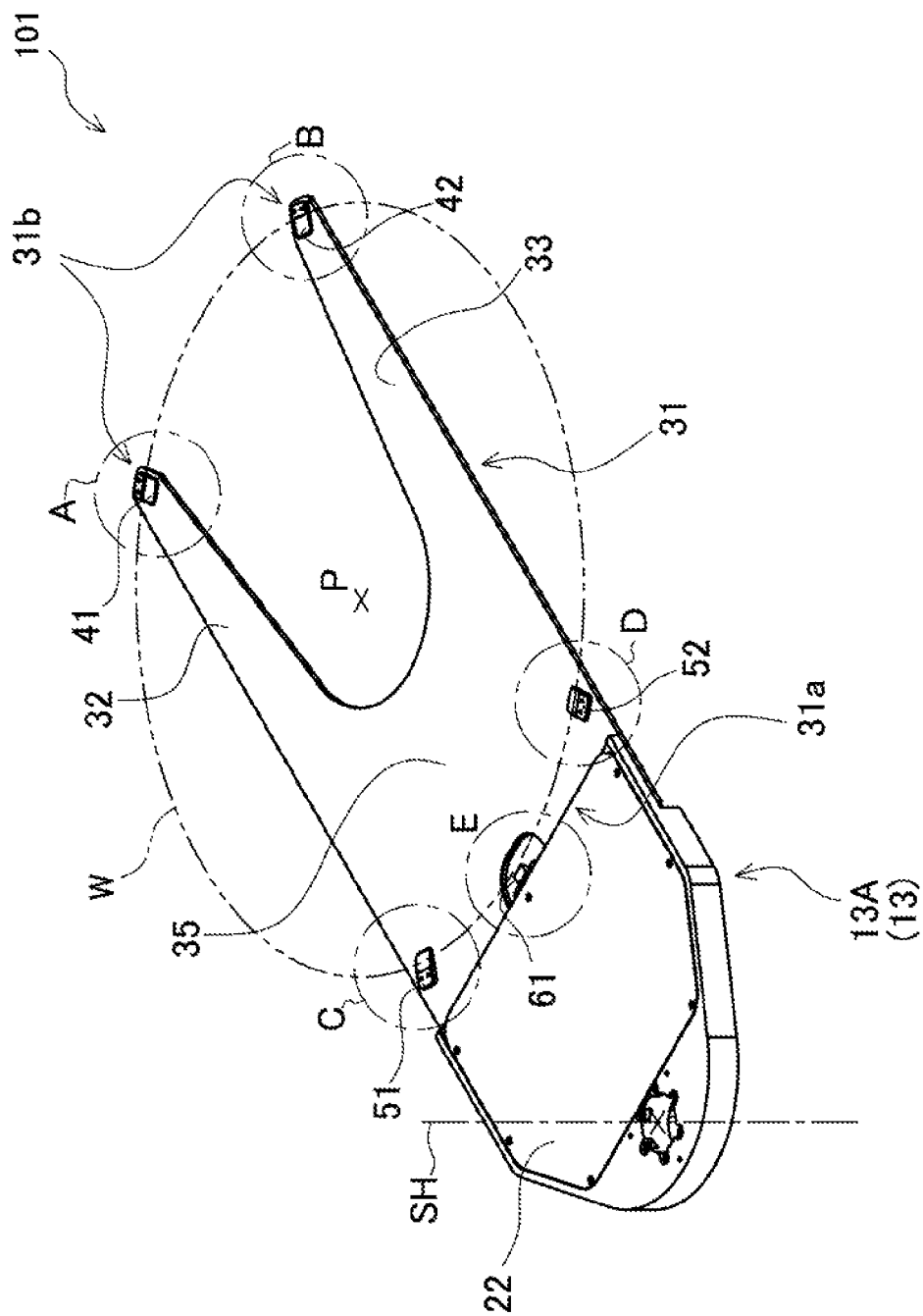
FIG. 3 is a perspective view of the clamping device.

As shown in FIG. 3, the hand portion 13A (13) is configured by the clamping device 101 being provided at the base portion 22 that is supported to be rotatable around the rotary shaft SH. This clamping device 101 is generally configured with a workpiece retaining base 31, stationary blocks 41, 42, 51, 52 and a movable block 61.

A workpiece retaining base 31 is formed as a substantially U-shaped flat plate on which two extension portions 32, 33 extend from a wide portion 35 on a side of a proximal end 31a toward a side of a distal end 31b, and on the side of the proximal end 31a, the substantially U-shaped flat plate is mounted to the base portion 22, whereby the flat plate is caused to be rotatable integrally with the base portion 22 with the flat plate being disposed substantially horizontally.

Further, in proximity to the distal end 31b on each of the extension portions 32, 33, distal end side stationary blocks 41, 42 are provided. Similarly, on the side of the proximal end 31a of the wide portion 35, proximal end side stationary blocks 51, 52 are provided. These four stationary blocks 41, 42, 51, 52 are arranged in a rectangular shape in a planar view, and a positional relationship is established in such a manner as to be able to support a side face of the workpiece W targeted to be retained, that is, an outer circumferential face.

In the present specification, a description of defining the side face of the workpiece W being inclusive of an edge forming a side face, supporting a side face, or alternatively, abutting against a side face includes supporting an edge that forms a side face, or alternatively, abutting against an edge.

In addition, a movable block 61 to be described later is provided between the proximal end side stationary blocks 51, 52 at a position that is proximal to these blocks and at a position that is slightly on the side of the proximal end 31a.

Figure 4:
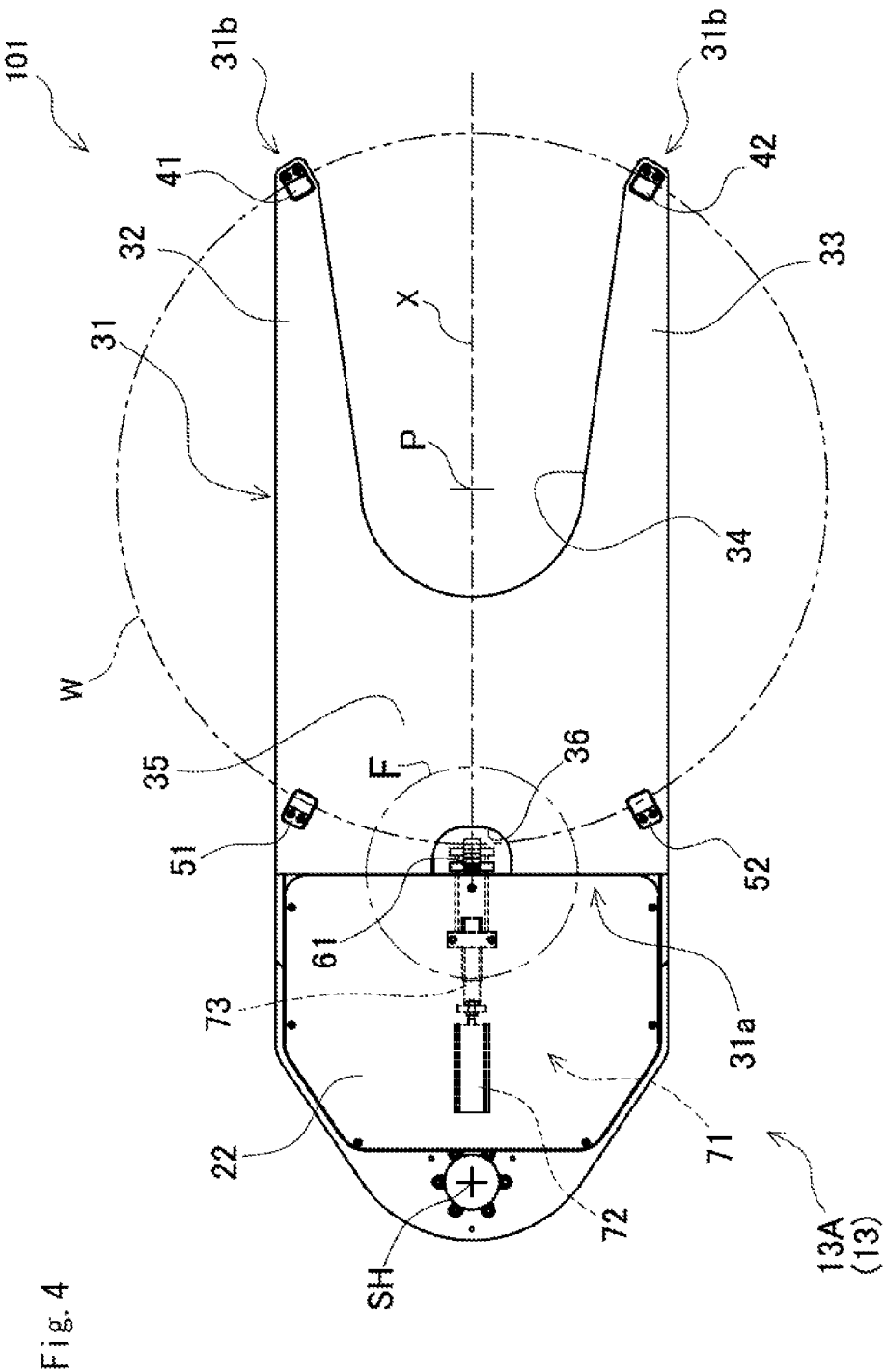
FIG. 4 is a plan view of the clamping device.

FIG. 4 illustrates a clamping device 101 by way of planar view.

As is evident from the figure, the abovementioned stationary blocks 41, 42, 51, 52 are set so that a center of a rectangle with these blocks each being an apex is set at a position that is substantially identical to a central position P of a workpiece W in a retained state. In addition, a longer edge of this rectangle is set so as to be along a direction in which the longer edge extends from the proximal end 31a to the distal end 31b of the workpiece retaining base 31. By doing so, around gravity of the workpiece W, the stationary blocks 41, 42, 51, 52 are arranged in a well-balanced manner, thus making it possible to stably retain the workpiece W.

The abovementioned movable block 61 is connected to a distal end of driving means 71 that is provided inside of the base portion 22. The driving means 71 forms a part of the abovementioned clamp device 101, and includes a directly movable air cylinder 72 and a directly moving guide 73, enabling the movable block 61 to move in a predetermined stroke linearly toward the central position P of the workpiece W.

Figure 8:
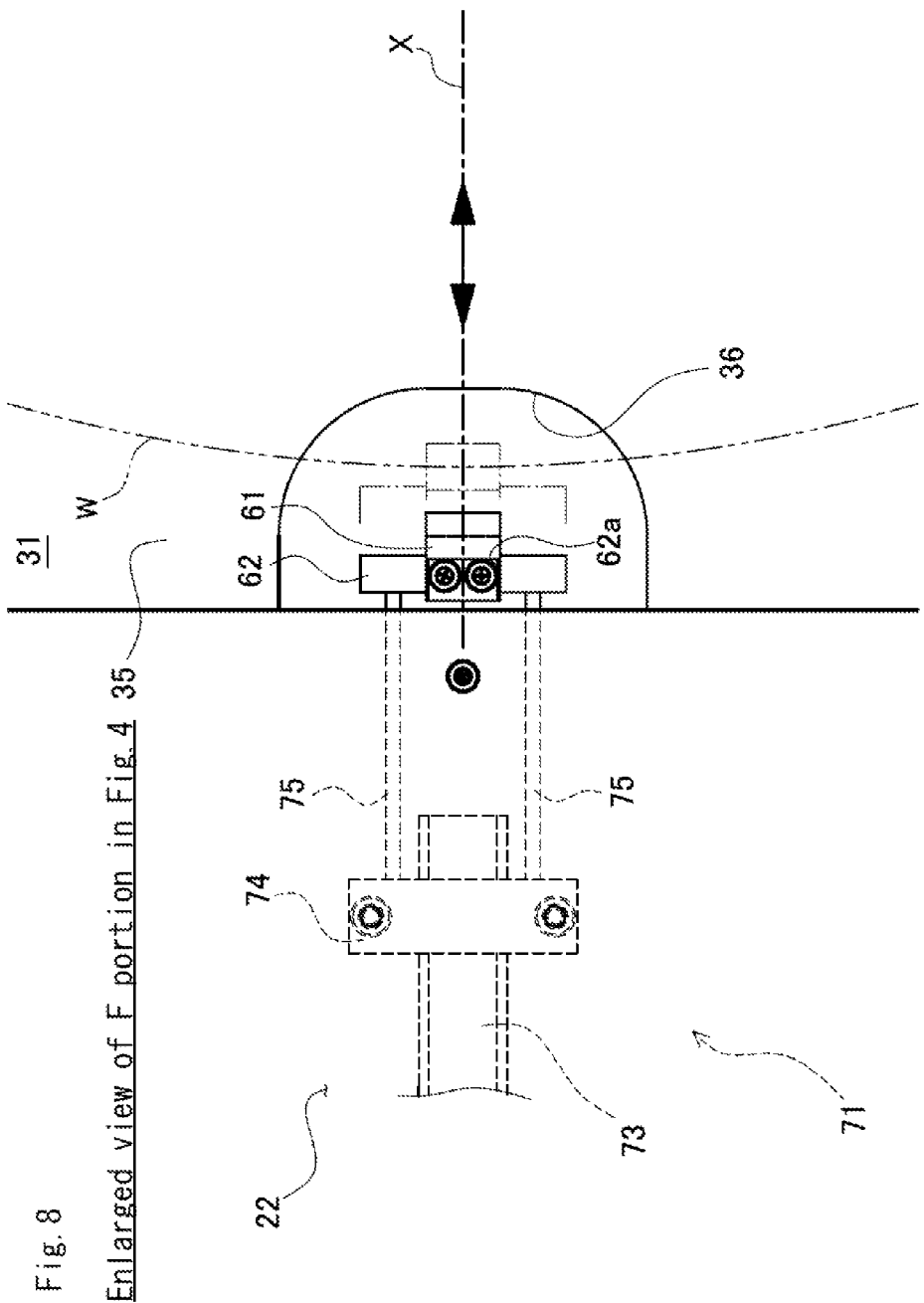
FIG. 8 is an enlarged plan view showing an F portion in FIG. 4 in an enlarged manner.

With reference to FIG. 8, more specifically, on the directly moving guide 73, a block member 74 is supported in a linearly movable manner, and the block member 74 and a base block 62 are connected to each other by means of a pair of rod-shaped guide members 75, 75. Further, a movable block 61 is provided inside of a rectangular cutout portion 62a that is formed at an upper part of this base block 62. By doing so, the movable block 61 can be operated integrally with the block member 74, and the block member 74 is operated by means of the abovementioned air cylinder 72, thus making it possible to linearly move the movable block 61.

A operational direction of the movable block 61 toward the workpiece 61 at this juncture is referred to as an advancement direction, and an opposite direction to the operation direction is referred to as a retraction direction. In addition, the movable block 61 is arranged inside of an opening portion 36 that is formed on the side of the proximal end portion 31a of the wide portion 35, enabling an advancing/retracting operation inside of the opening portion.

The movable block 61 is set so as not to come into contact with a side face of the workpiece W in an ordinary retraction position that is indicated by the solid line in the figure and then advances toward the workpiece W to thereby abut against the side face of the workpiece W and then enable positioning and retention of the workpiece W. Turning to FIG. 4, the movable block 61 is set so that its center moves on a straight line X connecting a rotary shaft. SH and a central position P of the workpiece W to each other in a planar view. This straight line X is referred to as an operational straight line X in the movable block 61. Therefore, an orientation in which the movable block 61 operates is defined as a direction oriented to the central position P of the workpiece, that is, a gravitational position, thus making it possible to stably perform positioning of the workpiece W.

In addition, if the fact that each of the stationary blocks 41, 42, 51, 52 mentioned above is disposed in a rectangular shape having a center substantially the same as the central position P of the workpiece W is restated around the operational straight line X indicating the operation direction of the movable block 61, it can be said that a pair of the distal end side stationary blocks 41, 42 and a pair of the proximal end side stationary blocks 51, 52 are respectively arranged at positions that are symmetrical to each other with the operational straight line X being held between the blocks.

Figure 5:
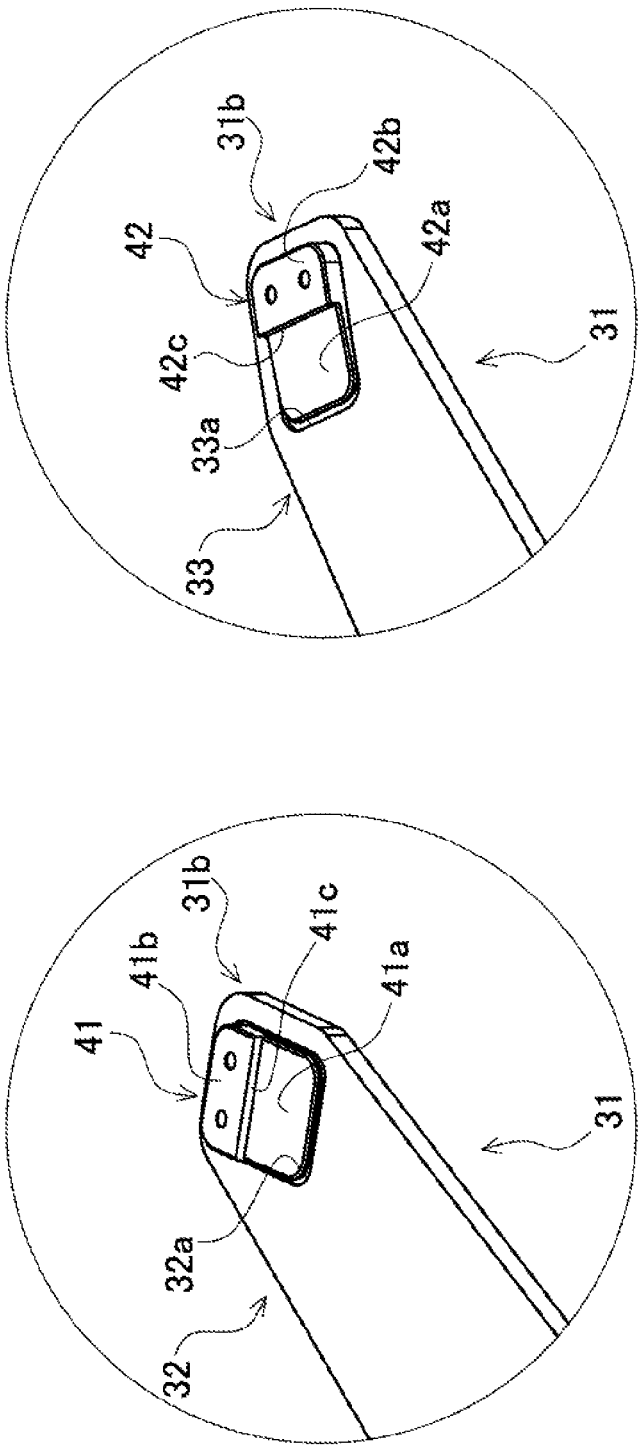
FIG. 5(a) and FIG. 5(b) are enlarged perspective views respectively showing an A portion and a B portion in FIG. 3 in an enlarged manner.

The distal end side stationary blocks 41, 42 are configured as shown in FIG. 5. FIG. 5 (a) shows the distal end side stationary block 41 that is provided at the extension portion 32, and FIG. 5 (b) shows the distal end side stationary block 42 that is provided at an extension portion 33. The above distal end side stationary block 41, 42 are formed in a same shape except that these blocks are different from each other in mounting position and mounting direction on the workpiece retaining base 31. The distal end side stationary blocks 41, 42 are formed in a substantially rectangular shape in a planar view. In proximity to each of the distal ends 31b, 31b of the extension portions 32, 33, substantially rectangular recessed portions 32a, 33a that are slightly larger than the distal end side stationary blocks 41, 42 are formed, and at the insides of these recessed portions, the distal end side stationary blocks 41, 42 are respectively fixed. The recessed portions 32a, 33a are formed with a high precision relative to the respective extension portions 32, 33 of the workpiece retaining base 31, and inside faces of these recessed portions 32a, 33a are mounted as guiding members, thereby making it possible to mount the distal end side stationary blocks 41, 42 with a high precision.

The distal end side stationary blocks 41, 42 respectively include upward stationary tilt faces 41a, 42a retaining a side face of the workpiece W. These upward stationary tilt faces 41a, 42a each are formed in a planar shape, and are also formed in an orientation tiling downwardly toward the central position P (refer to FIG. 3) of the workpiece W. In addition, protrusion portions 41b, 42b extending vertically upwardly are respectively formed so as to be continuous to upper ends of the upward stationary tilt faces 41a, 42b, and at the insides of these extension portions, that is, side faces 41c, 42c on the side of the upward stationary tilt faces 41a, 42a each serve as a face vertical to the central direction relative to the workpiece W, and also function as an abutment face when alignment of the workpiece W is performed.

Figure 6:
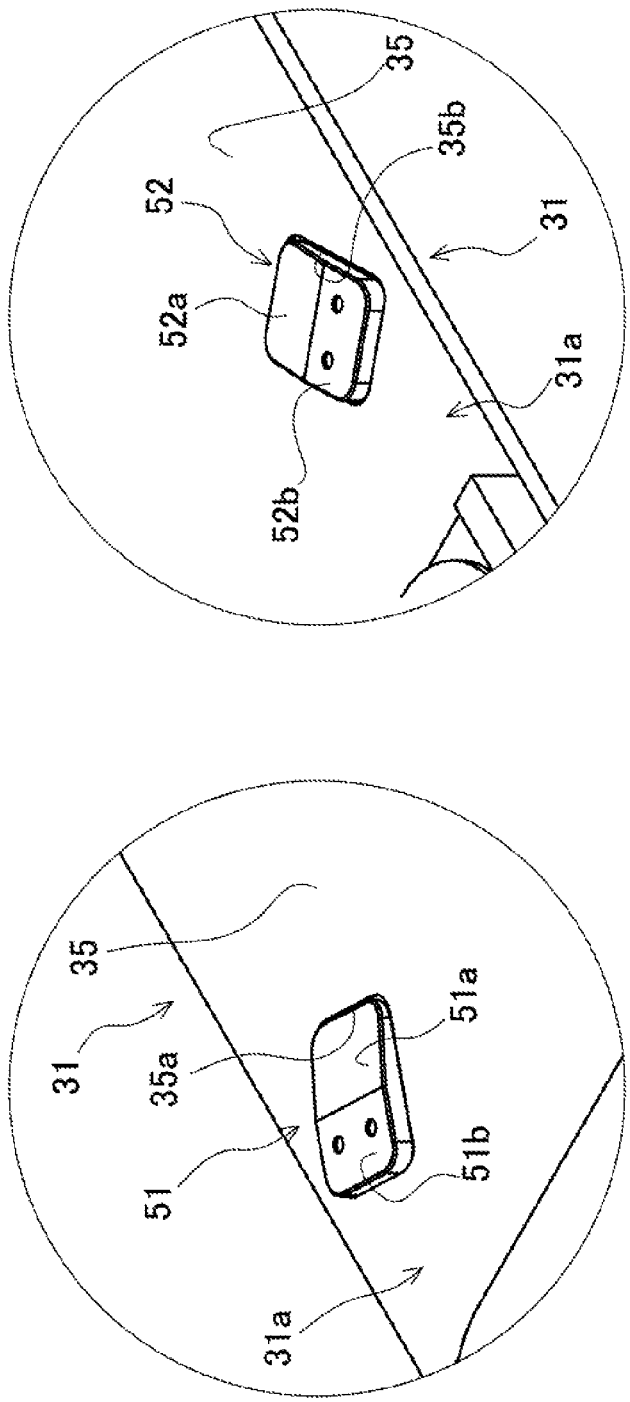
FIG. 6(c) and FIG. 6(d) are enlarged perspective views respectively showing a C portion and a D portion in FIG. 3 in an enlarged manner.

The proximal end side stationary blocks 51, 52 are configured as shown in FIG. 6. FIG. 6 (a) and FIG. 6 (b) respectively show the proximal end side stationary blocks 51, 52 provided at the wide portion 35. These proximal end side stationary blocks 51, 52 each are formed in a same shape except that these blocks are different from each other in mounting position and mounting direction on the workpiece retaining base 31. The proximal end side stationary blocks 51, 52 each are formed in a substantially rectangular shape in a planar view. On the side of the proximal end 31a of the wide portion 35 and at a position that is spaced in a transverse direction, substantially rectangular recessed portions 35a, 35b that are respectively slightly larger than the proximal end side stationary blocks 51, 52 are formed, and at the insides of these recessed portions, the proximal end side stationary blocks 51, 52 are respectively fixed.

Like the distal end side stationary blocks 41, 42, the proximal end side stationary blocks 51, 52 also respectively include upward stationary tilt faces 51a, 52a retaining a side face of the workpiece W. The upward stationary tilt faces 51a, 52a each are formed in a planar shape, and are also formed in an orientation tilting downwardly toward the central position P (refer to FIG. 3) of the workpiece W. In addition, horizontal faces 51b, 52b each are formed at a position opposite to that of the workpiece W so as to be continuous to the upward stationary tilt faces 51a, 52a.

Figure 7:
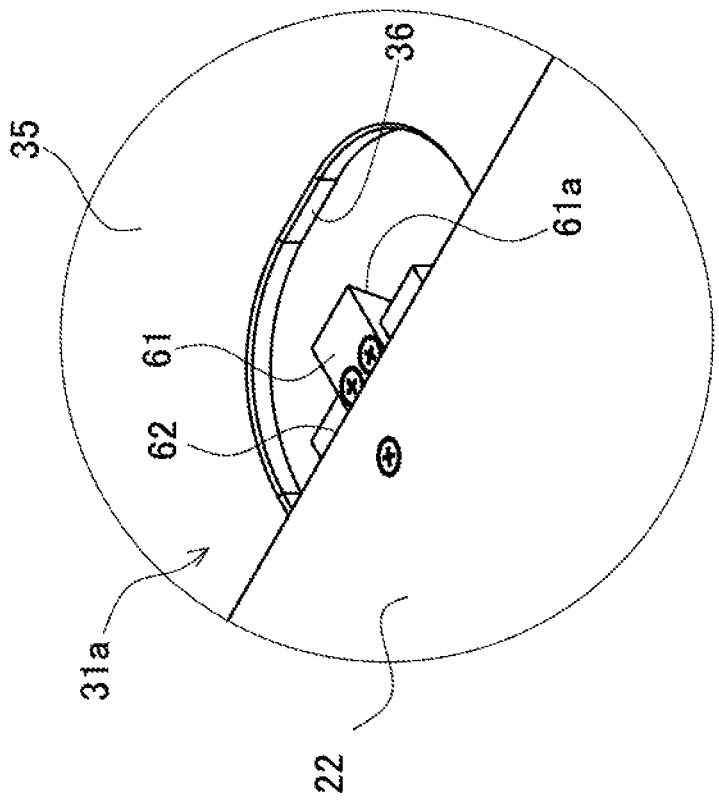
FIG. 7 is an enlarged perspective view showing an E portion in FIG. 3 in an enlarged manner.

The movable block 61 is configured as shown in FIG. 7. The movable block 61 includes a downward movable tilt face 61a that is formed to tilt upwardly toward the central position P (refer to FIG. 3) of the workpiece W. The downward movable tilt face 61a advances toward the workpiece W, as described above, enabling abutment against a side face of the workpiece W.

Figure 9:
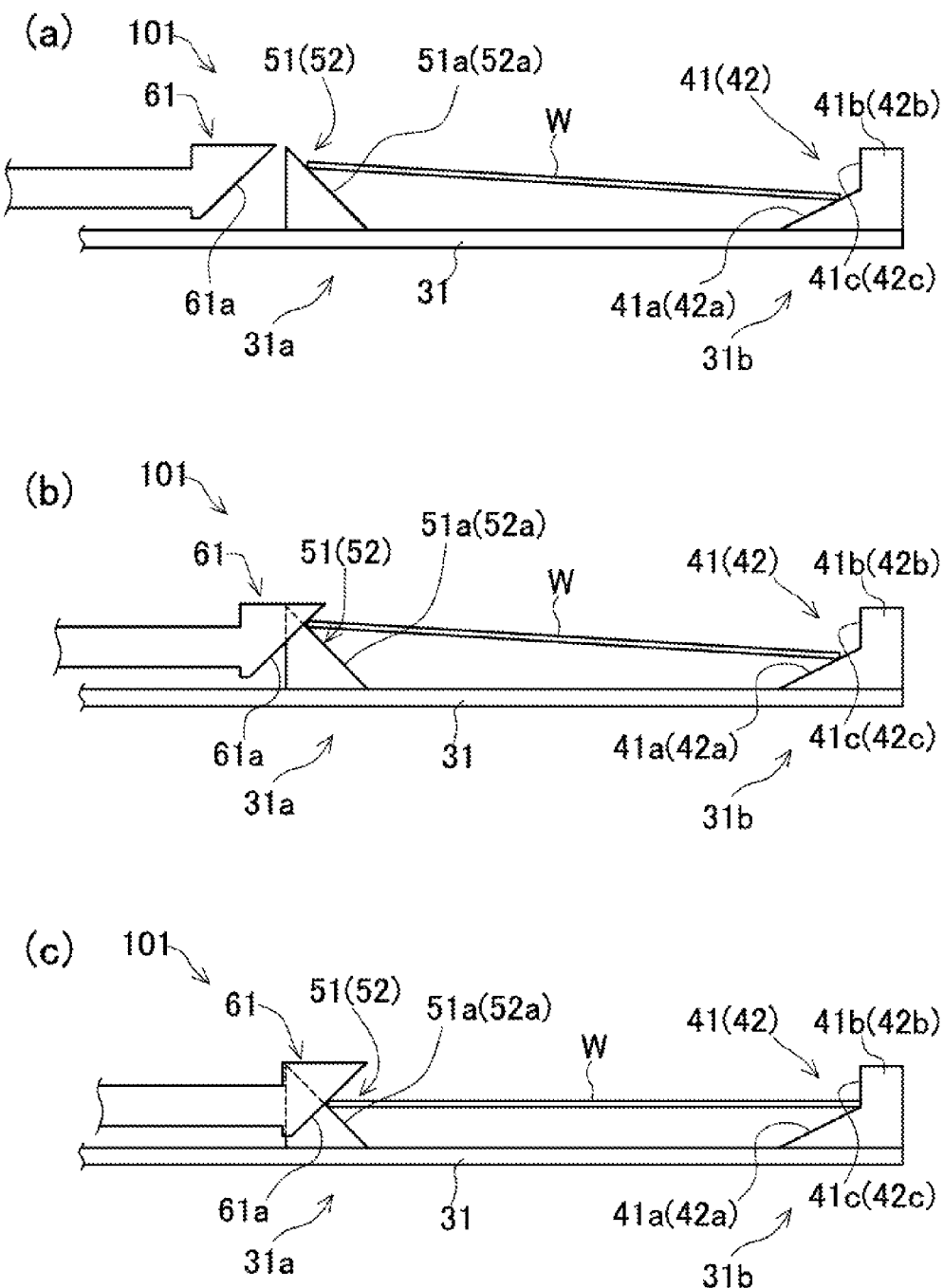
FIG. 9(a) through FIG. 9(c) are illustrative views schematically illustrating an operation of a clamping device of the present invention.
Figure 10:
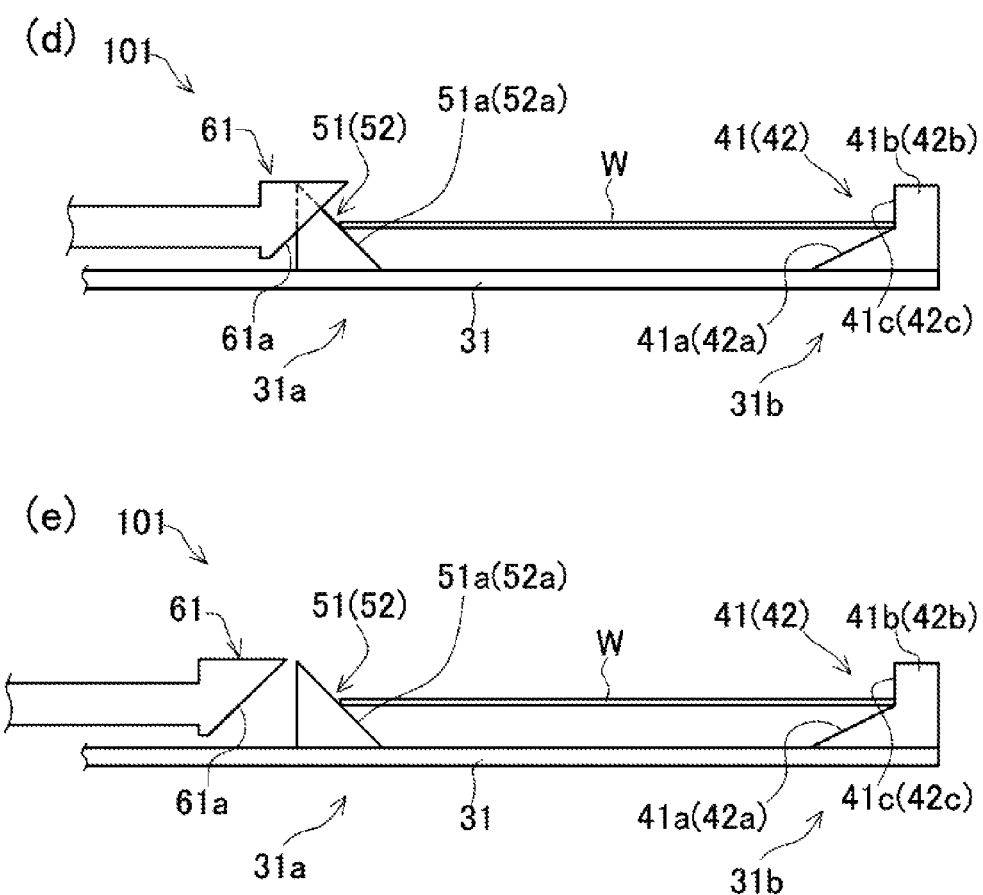
FIG. 10(d) and FIG. 10(e) are illustrative views schematically illustrating an operation of the clamping device of the present invention to be continued from FIG. 9.

Employing the clamping device 101 configured as described above, the workpiece W can be retained and conveyed by operating as follows. Hereinafter, with reference to FIG. 3, a description will be given by employing FIG. 9 and FIG. 10. FIG. 9 and FIG. 10 are illustrative views schematically showing the clamping device 101 of the embodiment and illustrating operations related to retention and release of retention of the workpiece W.

First, as shown in FIG. 9(a), a workpiece is received on the workpiece retaining base 31. At this juncture, the workpiece W is placed across on each of the upward stationary tilt faces 41a, 42a, 51a, 52a of the distal end side stationary blocks 41, 42 and the proximal end side stationary blocks 51, 52. The stationary blocks 41, 42, 51, 52 each are arranged in a rectangular shape around the central position P of the workpiece W, that is, a gravitational position, as described above, thus, a side face of the workpiece W is established while in abutment against each of the upward stationary tilt faces 41a, 42a, 51a, 52a. However, if advancement of the movable block 61 is not made, the workpiece W is not precisely positioned, and is not always horizontal.

From this state, if the movable block 61 advances toward the workpiece W, a downward movable tilt face 61a abuts against a side face of the workpiece W, as shown in FIG. 9 (b), partway of reaching a stroke end.

Further, the movable block 61 is caused to advance toward the workpiece W, and as shown in FIG. 9 (c), and is caused to reach the stroke end and then the workpiece W is kept to be retained. In the course of reaching this retained state, the movable block 61 pushes the workpiece W against the distal end side stationary blocks 41, 42 by means of the downward movable tilt face 61a, lifts up a distal end side of the workpiece W along each of the upward stationary tilt faces 41a, 42a, and is positioned so as to abut against the side faces 41c, 42c. At this juncture, distal end side stationary blocks 41, 42 are arranged in a pair at positions that are symmetrical to each other while the operational straight line X on which a center of the movable block 61 moves is held between the blocks, thus, a positional adjustment can be effectively performed without a position of the workpiece W being shifted in a transverse direction relative to a direction of the pushing by means of the movable block 61.

In addition, protrusion portions 41b, 42b, having side faces 41c, 42c for abutment with the workpiece W, are respectively provided in the distal end side stationary blocks 41, 42 and therefore when the workpiece W is retained, positioning can be performed with a higher precision.

In addition, a side face of the workpiece W is vertically held by means of the upward stationary tilt faces 51*a*, 52*a* of the proximal end side stationary blocks 51, 52 on the proximal end side and the downward movable tilt face 61*a* of the movable block 61, thus making it possible to restrain operation of the workpiece W in a vertical direction and to have a strong force of retention relative to a vibration. At this juncture, proximal end side stationary blocks 51, 52 are arranged in a pair at positions that are symmetrical to each other while the operational straight line X on which the center of the movable block 61 moves is held between the blocks, therefore, the side face of the workpiece W can be retained at three points of the proximal end side stationary blocks 52, 52 and the movable block 61 in a well-balanced manner, and all of the upward stationary tilt faces 51*a*, 52*a* of the proximal end side stationary blocks 51, 52 and the downward movable tilt face 61*a* of the movable block 61 abut against the side face of the workpiece W without an occurrence of a positional shift in a vertical direction.

While the workpiece W is thus retained with a strong force of retention, the hand portion 13 (refer to FIG. 1) is operated, and the workpiece W can be conveyed up to a predetermined position. With a structure which is rigid relative to a vibration, even if conveyance of the workpiece W is performed at a high speed, no positional shift occurs, and positioning of the workpiece W can be appropriately performed.

Further, when the workpiece W is retained, unlike the conventional clamping device, the workpiece W can be caused to abut against the upward stationary tilt faces 51*a*, 52*a* of the proximal end side stationary blocks 51, 52 as well.

Therefore, for the sake of release of retention of the workpiece W, even if the movable block 61 is retracted as shown in FIG. 10 (*d*) to FIG. 10 (*e*), the side face of the workpiece W is maintained in a state of abutment against the upward stationary tilt faces 51*a*, 52*a* of the proximal end side stationary blocks 51, 52, and no positional shift occurs. That is, even at the time of release of retention of the workpiece W, unlike the conventional clamping device, a position of the workpiece W can be retained with a high precision.

Therefore, by employing this clamping device 101, after the workpiece W has been received, when the received workpiece W is retained on the hand portion 13, positioning of the workpiece W can be performed with a high precision, and a strong force of retention relative to a vibration is exerted. Further, when release of retention of the workpiece W is performed, it can be said that the workpiece W can be delivered while its related position is retained with a high precision without a positional shift being caused to occur to the workpiece W.

As described hereinbefore, a clamping device in the embodiment is a clamping device 101 that is capable of performing retention and release of retention of a workpiece W, on a workpiece retaining base 31, and this clamping device is configured so as to include: distal end side stationary blocks 41, 42 which are provided on a side of a distal end 31*b* thereof and on the workpiece retaining base 31, and in which stationary tilt faces 41*a*, 42*a* tilting downwardly to a central direction of the workpiece W are formed; proximal end side stationary blocks 51, 52 which are provided on a side of a proximal end 31*a* opposing to the distal end side stationary blocks 41, 42 with the workpiece W being held between the blocks and on the workpiece retaining base 31, and in which upward stationary tilt faces 51*a*, 52*a* tilting downward toward the central direction of the workpiece W are formed; and a movable block 61 which is arranged at a position proximal to the proximal end side stationary blocks 51, 52, and is capable of advancing to or retracting from a side of the distal end side stationary blocks 41, 42 with the workpiece W being held between the blocks, and in which a downward movable tilt face 61 tilting upwardly toward the central direction of the workpiece W is formed.

With such a configuration, at the time of retention of the workpiece W, the stationary blocks 41, 42, 51, 52 and the movable block 61 work together, thus making it possible to precisely perform positioning of the workpiece. At this juncture, the workpiece is not spaced from each of the upward stationary tilt faces 41*a*, 42*a*, 51*a*, 52*a*, therefore, even if the movable block 61 is retracted as release of retention of the workpiece W, the workpiece W can be kept to be supported by each of the upward stationary tilt faces 41*a*, 42*a*, 51*a*, 52*a*, thus making it possible to maintain a high positional precision without an occurrence of a positional shift of the workpiece W. In addition, the workpiece W is supported in a vertical direction when the workpiece W is retained and therefore a strong force of retention is exerted, and even if a vibration occurs, the workpiece W can be strongly retained.

In addition, the center of the movable block 61 is configured so as to be moved on the predetermined operational straight line X, and is also configured so that distal end side stationary blocks 41, 42 are arranged in a pair at positions that are symmetrical to each other while the operational straight line X is held between the blocks in a planar view. Thus, when the movable block 61 advances to the workpiece W and then performs retention of the workpiece W, the workpiece W is restrained by means of the movable block 61 and the distal end side blocks 41, 42 opposing to the movable block, making it possible to perform precise positioning more stably without an occurrence of a positional shift of the workpiece in a transverse direction.

In addition, the proximal end side stationary blocks 51, 52 are configured so as to be arranged in a pair at positions that are symmetrical to each other with the operational straight line X being held in a planar view. Thus, when the movable block 61 advances to the workpiece W and then performs retention of the workpiece W the proximal end side of the workpiece W can be positioned at three points in a vertical direction, making it possible to prevent a positional shift of the workpiece in the vertical direction and perform precise positioning more stably.

In addition, the distal end side stationary blocks 41, 42 are configured so as to include the protrusion portions 41*b*, 42*b* that are continuous to upper ends of the upward stationary tilt faces 41*a*, 42*a*, and that extend vertically upwardly. Thus, the proximal end side stationary blocks 51, 52 and the movable block 62 work together whereby a side face of the workpiece W can be precisely retained, making it possible to perform positioning with a higher precision at the time of retention of the workpiece W.

In addition, this clamping device 101 further includes a controller 102 that controls an advancing/retracting operation of the movable block 61 to advance the movable block 61 so that the downward movable tilt face 61*a* abuts against a side face of the workpiece W with the workpiece W being placed across the upward stationary tilt faces 41*a*, 42*a*, 51*a*, 52*a* of the respective stationary blocks 41, 42, 51, 52 when retention of the workpiece W is performed on the workpiece retaining base 31 and to retract the movable block 61 in a direction opposite to that of the workpiece W when release of retention of the workpiece W is performed on the workpiece retaining base 31, thus making it possible to appropriately perform retention and release of retention of the workpiece.

In addition, the workpiece W targeted to be conveyed is formed in the shape of a disk of which a side face is defined as an outer circumferential face. Therefore, a gravitational balance of the workpiece W can be preferably maintained, and a position in a direction of the pushing by means of the movable block 61 can be appropriately maintained from a relationship with a gravitational position, making it possible to significantly attain the advantageous effect mentioned above and to perform positioning with a high precision.

Further, the workpiece conveying robot 100 of the embodiment, which includes the abovementioned clamping device 101 at the hand portion 13, is capable of conveying the workpiece W while retaining the workpiece W with a high positional precision and with a great force of retention, which is strong relative to a vibration, and thereafter, performing release of retention and then delivering the workpiece W while maintaining a high positional precision.

A specific configuration of each constituent element is not limited to only the embodiment described above.

For example, while, in the foregoing embodiment, a disk-shaped workpiece W was used, the present invention can be applied even if the workpiece is formed in a variety of plate shapes such as a rectangle or a triangle. Further, it is also possible to employ a workpiece W formed in a variety of shapes such as a blocky shape without being limited to the disk shapes as long as the workpiece has a face supported by the stationary blocks 41, 42, 51, 52 or the movable block 61. However, as long as the shape of a workpiece is simple and its gravitational balance is appropriate, the abovementioned advantageous effect can be attained more significantly and therefore in this point of view, it is preferable that a workpiece be formed in the shape of a disk.

Also, various modifications can occur to other constituent elements without departing from the spirit of the present invention.

What is claimed is:

1. A clamping device that is capable of performing retention and release of retention of a workpiece on a workpiece retaining base, the clamping device comprising:
    a distal end side stationary block which is provided on a side of a distal end of the workpiece retaining base and on the workpiece retaining base, and in which an upward stationary tilt face tilting downwardly toward a central direction of the workpiece is formed;
    a proximal end side stationary block which is provided on a side of a proximal end opposing to the distal end side stationary block with the workpiece being held between the blocks and on the workpiece retaining base, and in which an upward stationary tilt face tilting downwardly toward the central direction of the workpiece is formed;
    a movable block which is arranged at a position proximal to the proximal end side stationary block, and is capable of advancing to or retracting from a side of the distal end side stationary block with the workpiece being held between the blocks, and in which a downward movable tilt face tilting upwardly toward the central direction of the workpiece is formed;
    a center of the movable block is configured so as to be moved on a predetermined operational straight line, and the distal end side stationary block is arranged in a pair at positions that are symmetrical to each other with the operational straight line being held therebetween in a planar view; and
    a controller that controls an advancing/retracting operation of the movable block to advance the movable block so that the downward movable tilt face abuts against a side face of the workpiece when retention of the workpiece is performed on the workpiece retaining base with the workpiece being placed across the upward stationary tilt faces of the respective stationary blocks and to retract the movable block in an opposite direction to a direction of the workpiece when release of retention of the workpiece is performed on the workpiece retaining base.

2. The clamping device according to claim 1, wherein the proximal end side stationary block is arranged in a pair at positions that are symmetrical to each other with the operational straight line being held therebetween in a planar view.

3. The clamping device according to claim 2, wherein the distal end side stationary block includes a protrusion portion that is continuous to an upper end of an upward stationary tilt face and that extends vertically upwardly.

4. The clamping device according to claim 2, wherein the workpiece is formed in a disk shape of which the side face is defined as an outer circumferential face.

5. A workpiece conveying robot comprising the clamping device according to claim 2 at a hand portion.

6. The clamping device according to claim 1, wherein the distal end side stationary block includes a protrusion portion that is continuous to an upper end of an upward stationary tilt face and that extends vertically upwardly.

7. The clamping device according to claim 6, wherein the workpiece is formed in a disk shape of which the side face is defined as an outer circumferential face.

8. A workpiece conveying robot comprising the clamping device according to claim 1 at a hand portion.

9. The clamping device according to claim 1, wherein the distal end side stationary block includes a protrusion portion that is continuous to an upper end of an upward stationary tilt face and that extends vertically upwardly.

10. The clamping device according to claim 1, wherein the workpiece is formed in a disk shape of which the side face is defined as an outer circumferential face.

11. A workpiece conveying robot comprising the clamping device according to claim 1 at a hand portion.

* * * * *